US009127186B2

(12) United States Patent
Arita et al.

(10) Patent No.: US 9,127,186 B2
(45) Date of Patent: Sep. 8, 2015

(54) FILM SEALANT AND SEALING METHOD

(75) Inventors: Hiroaki Arita, Himeji (JP); Yoshiki Nakaie, Himeji (JP); Taiji Yamabe, Tokyo (JP)

(73) Assignee: DAICEL-EVONIK LTD., Tokyo (JP)

( * ) Notice: Subject to any disclaimer, the term of this patent is extended or adjusted under 35 U.S.C. 154(b) by 0 days.

(21) Appl. No.: 13/823,479

(22) PCT Filed: Sep. 21, 2011

(86) PCT No.: PCT/JP2011/071518
§ 371 (c)(1),
(2), (4) Date: Mar. 14, 2013

(87) PCT Pub. No.: WO2012/039436
PCT Pub. Date: Mar. 29, 2012

(65) Prior Publication Data
US 2013/0171440 A1 Jul. 4, 2013

(30) Foreign Application Priority Data

Sep. 22, 2010 (JP) .................................. 2010-212537
Sep. 13, 2011 (JP) .................................. 2011-199852

(51) Int. Cl.
B32B 37/00 (2006.01)
C09D 177/06 (2006.01)
B32B 37/04 (2006.01)
H01L 23/29 (2006.01)
H05K 3/28 (2006.01)

(52) U.S. Cl.
CPC .............. *C09D 177/06* (2013.01); *B32B 37/04* (2013.01); *H01L 23/291* (2013.01); *H01L 23/293* (2013.01); *H05K 3/284* (2013.01); H01L 2924/0002 (2013.01); H01L 2924/12044 (2013.01); *H05K 3/281* (2013.01); H05K 2201/0129 (2013.01); H05K 2203/1311 (2013.01); *Y10T 156/10* (2015.01); *Y10T 428/2896* (2015.01)

(58) Field of Classification Search
CPC ..... H05K 3/281; H05K 3/284; C09D 177/06; H01L 23/293; B32B 37/04
USPC ............. 156/308.2, 309.6, 69, 82, 309.9, 322
See application file for complete search history.

(56) References Cited

U.S. PATENT DOCUMENTS

| 4,093,492 | A | * | 6/1978 | Raabe et al. | ............... 156/331.8 |
| 4,397,401 | A | * | 8/1983 | Ueno et al. | ................... 220/260 |
| 6,538,709 | B1 | | 3/2003 | Kurihara et al. | |
| 7,160,979 | B2 | | 1/2007 | Nataniel et al. | |
| 2002/0036898 | A1 | | 3/2002 | Miyakawa et al. | |

FOREIGN PATENT DOCUMENTS

| EP | 0036320 A1 | 9/1981 |
| JP | 56-136826 A | 10/1981 |
| JP | 63-189458 A | 8/1988 |
| JP | 11-259021 A | 9/1999 |
| JP | 2000-133665 A | 5/2000 |
| JP | 2001-234125 A | 8/2001 |
| JP | 2001-284779 A | 10/2001 |
| JP | 2005-209995 A | 8/2005 |
| JP | 2007-66686 A | 3/2007 |
| JP | 2008-282906 A | 11/2008 |
| JP | 2009-99417 A | 5/2009 |
| JP | 2009-99805 A | 5/2009 |
| JP | 2009-147289 A | 7/2009 |

OTHER PUBLICATIONS

Translation of Written Opinion of the International Searching Authority and (Forms PCT/IB/338 and PCT/ISA/237) dated Apr. 25, 2013, for International Application No. PCT/JP2011/071518.
International Search Report issued in PCT/JP2011/071518, mailed on Feb. 7, 2012.
Chinese Office Action dated Jul. 16, 2014 for Chinese Application No. 201180056311.4 with English translation.
Office Action dated Apr. 21, 2015 for Taiwanese Patent Application No. 100134101 with English Translation.

* cited by examiner

*Primary Examiner* — John Goff
(74) *Attorney, Agent, or Firm* — Birch, Stewart, Kolasch & Birch, LLP

(57) ABSTRACT

A film sealant useful for tightly sealing an electric device at a low temperature and a sealing method of using the sealant are provided. The device is covered and sealed by covering at least a region of the device with a film sealant containing a copolyamide-series resin, heat-melting the sealant, and cooling the sealant. The copolyamide-series resin may have a melting point or softening point of 75 to 160° C. and may be a crystalline resin. The copolyamide-series resin may be a multiple copolymer or may contain a unit derived from a long-chain component having a $C_{8-16}$alkylene group (e.g., a $C_{9-17}$lactam and an amino$C_{9-17}$alkanecarboxylic acid). The film sealant may cover one side of the device.

7 Claims, No Drawings

FILM SEALANT AND SEALING METHOD

TECHNICAL FIELD

The present invention relates to a film sealant suitable for sealing a device (or an electronic device) such as a printed wiring board mounted with an electronic part, a sealing method using the film sealant.

BACKGROUND ART

In order to protect a precision part (or an electronic device) against moisture, dust and other unfavorable substances, the precision part (such as a semiconductor element, a printed wiring board, or a solar cell) is sealed (or encapsulated) with a resin. As the sealing method, a known method of sealing a precision part comprises placing the precision part in a mold cavity and injecting a fluid resin into the cavity. This method uses a thermosetting resin having a low viscosity and a high flowability in many cases.

However, the thermosetting resin shortens a storage life due to an additive (such as a crosslinking agent) added to the thermosetting resin, and requires a relatively long time from injection of the resin into a mold cavity to curing of the resin. Thus, the thermosetting resin cannot achieve improvement of efficient production. Further, depending on the species of the resin, it is necessary to cure the resin after molding, which deteriorates production efficacy.

Moreover, it is known that a thermoplastic resin is injection-molded to seal a precision part. The thermoplastic resin, however, is practically injected at a relatively high temperature and high pressure, and thus a substrate or an electronic part mounted on a substrate is liable to damage and loses the reliability. Japanese Patent Application Laid-Open Publication No. 2000-133665 (JP-2000-133665A, Patent Document 1) discloses a method of sealing a printed wiring board mounted with an electronic part, the method comprising placing a printed wiring board equipped with an electronic part in a mold cavity and injecting a heat-melted polyamide resin having a temperature of 160 to 230° C. into the mold cavity at a pressure range of 2.5 to 25 kg/cm$^2$. This document discloses in Examples that a polyamide resin (Series Number 187) manufactured by TRL (France) is injected into a mold at a melting temperature of 190° C. and a pressure of 20 kg/cm$^2$ to seal a printed wiring board. This method, however, also exposes the electronic part to relatively high temperature and high pressure, and the electronic part is sometimes damaged.

Packing of a device by a film is also known. Japanese Patent Application Laid-Open Publication No. 2001-284779 (JP-2001-284779A, Patent Document 2) discloses a process for producing a sealed part of an electronic circuit; the process includes a method comprising inserting a circuit board (1) provided with electronic parts (2, 2A) into a cylindrical film (3) and closing both openings of the cylindrical film to pack the circuit board, a method comprising covering a region of the electronic parts with sheet films (3A, 3B), a method comprising covering both sides of a circuit board (1) with two sheet films (3A, 3B) and wrapping the circuit board with the sheet films. This document also discloses a method comprising covering the circuit board with film(s) previously softened by heat and a method comprising reducing a pressure between the board and the film(s) for following the film(s) to the above-mentioned part or board. Japanese Patent Application Laid-Open Publication No. 11-259021 (JP-11-259021A, Patent Document 3) discloses a liquid crystal display panel comprising liquid crystal display panel members consisting of a plurality of liquid crystal display panel members and a film, the panel members being covered and laminated with the film. This document also discloses a polyamide as an example of a plastic film.

In these methods, however, a device (such as an electronic part) cannot be sealed by tight adhesion. In particular, since these methods protect a device against moisture or water in a wrapping manner, the device cannot effectively be protected in covering only one side of the device.

Further, it is also known to seal a device using a film sealant. Japanese Patent Application Laid-Open Publication No. 2008-282906 (JP-2008-282906A, Patent Document 4) relates to a process for producing a solar cell module comprising a solar cell sealed between a substrate and a film by a resin; in the process, a first sealing-resin sheet substantially covering the whole surface of the substrate is disposed between the substrate and the solar cell, and a second sealing-resin sheet substantially covering the whole surface of the substrate is disposed between the film and the solar cell for preparing a layered structure. A plurality of the layered structures are stacked while a back plate is disposed outside the film of an uppermost layered structure, air between the substrate and the film is discharged and the resin is heat-melted and then cooled to seal the cell. This document discloses that the sealing-resin is selected from the group consisting of an ethylene-vinyl acetate copolymer, a poly(vinyl butyral), and a polyurethane.

Japanese Patent Application Laid-Open Publication No. 2009-99417 (JP-2009-99417A, Patent Document 5) discloses an organic electronic device sealing panel which comprises a substrate, an organic electronic device formed on the substrate, and a barrier film sealing the organic electronic device, and a hot-melt member is disposed between the organic electronic device and the barrier film. This document also discloses that the hot-melt member contains a moisture scavenger and a wax and that the hot-melt member is in a thin film having a thickness of not more than 100 μm. Moreover, Japanese Patent Application Laid-Open Publication No. 2009-99805 (JP-2009-99805A, Patent Document 6) discloses a hot-melt member for an organic thin-film solar cell, the member containing a moisture scavenger and a wax. This document also discloses that the hot-melt member may be in the form of a thin-film, a plate, an amorphous or indefinite, and others.

The film sealant, however, has low adaptability to an uneven portion (a depressed or raised portion) of a device, and thus it is difficult to seal the detailed exact or minutiae form of the device tightly. Further, since the above hot-melt member comprises a wax as a main component, it is difficult to seal the device with higher adhesion.

Japanese Patent Application Laid-Open Publication No. 2001-234125 (JP-2001-234125A, Patent Document 7) discloses a powder coating material for thermal spray coating; in order to prevent the coating material from discoloring even when exposed to high-temperature flames in a coating process, the coating material comprises 0.05 to 2.0 parts by weight of a hindered phenol-series antioxidant and 0.05 to 2.0 parts by weight of a phosphite-series antioxidant relative to 100 parts by weight of a thermoplastic resin, and has a medium particle diameter of 50 to 300 μm, a bulk specific gravity of not less than 0.30 g/ml and a repose angle of not more than 35°. In this document, the thermoplastic resin includes a polyethylene resin, a polypropylene resin, a nylon-11 resin, a nylon-12 resin, an ethylene-vinyl acetate copolymer resin, an ethylene-acrylic acid copolymer resin, an ethylene-methacrylic acid copolymer resin, a modified polyethylene resin, and a modified polypropylene resin. An example using a nylon (polyamide) resin (trade name "Grilamid" manufactured by EMS-CHEMIE AG) is also described in this document.

Since the above-mentioned powder coating material, however, is melted and sprayed at a high temperature, there is a possibility to easily damage the electronic part in the sealing process and the reliability of the device.

RELATED ART DOCUMENTS

Patent Documents

Patent Document 1: JP-2000-133665A (Claims and Examples)
Patent Document 2: JP-2001-284779A (Claims)
Patent Document 3: JP-11-259021A (Claims and [0022])
Patent Document 4: JP-2008-282906A (Claims)
Patent Document 5: JP-2009-99417A (Claims and [0024])
Patent Document 6: JP-2009-99805A (Claims)
Patent Document 7: JP-2001-234125A (Claims, [0008], and Example 6)

SUMMARY OF THE INVENTION

Problems to be Solved by the Invention

It is therefore an object of the present invention to provide a film sealant useful for tightly sealing an electronic device at a low temperature, and a sealing method using the sealant.

Another object of the present invention is to provide a film sealant which seals an electronic device tightly with high adhesion even when the sealant is applied to only one side of the device, and a sealing method using the sealant.

It is still another object of the present invention to provide a film sealant which can effectively protect an electronic device against moisture, dust or impact, and a sealing method using the sealant.

It is a further object of the present invention to provide a lamination film having not only an improved ability to seal an electronic device (an improved seal-ability) but also improved heat resistance and chemical resistance, and a sealing method using the lamination film.

It is a still further object of the present invention to provide an electronic device sealed with the film sealant or the lamination film.

Means to Solve the Problems

The inventors of the present invention made intensive studies to achieve the above objects and finally found that a film containing a copolyamide-series resin as a thermoplastic resin shortens sealing and molding cycles compared with a thermosetting resin, can seal a device by covering a predetermined region of the device at a low temperature and a low pressure, and can protect a device with high adhesion and seal-ability even when the sealant is applied to one side of the device. The present invention was accomplished based on the above findings.

That is, the film sealant (or film encapsulant) according to the present invention is a film sealant (or film encapsulant) comprising a copolyamide-series resin and sealing (or encapsulating) a device by covering (or molding). In the sealant having a film form of the present invention the copolyamide-series resin may have a melting point or softening point of about 75 to 160° C., for example, a melting point of about 90 to 140° C. The copolyamide-series resin may be a crystalline resin. The copolyamide-series resin may comprise a multiple copolymer, for example, at least one selected from the group consisting of a binary copolymer to a quaternary copolymer (e.g., a binary or ternary copolymer). Further, the copolyamide-series resin may contain a unit derived from a long-chain component having a $C_{8-16}$alkylene group (such as a $C_{10-14}$alkylene group), for example, at least one component selected from the group consisting of a $C_{9-17}$lactam and an amino$C_{9-17}$alkanecarboxylic acid. For example, the copolyamide-series resin may contain a unit derived from an amide-forming component (or an amide-formable component) for forming a polyamide selected from the group consisting of apolyamide 11, apolyamide 12, apolyamide 610, apolyamide 612, and a polyamide 1010; the copolyamide-series resin may comprise at least one member selected from the group consisting of a copolyamide 6/11, a copolyamide 6/12, a copolyamide 66/11, a copolyamide 66/12, a copolyamide 610/11, a copolyamide 612/11, a copolyamide 610/12, a copolyamide 612/12, a copolyamide 1010/12, a copolyamide 6/11/610, a copolyamide 6/11/612, a copolyamide 6/12/610, and a copolyamide 6/12/612. Moreover, the copolyamide-series resin may be a polyamide elastomer (a polyamide block copolymer) containing a unit derived from an amide-forming component for forming a polyamide selected from the group consisting of a polyamide 11, a polyamide 12, a polyamide 610, a polyamide 612 and a polyamide 1010, if necessary as a hard segment. Further, the copolyamide-series resin may contain a unit derived from at least one component selected from the group consisting of laurolactam, aminoundecanoic acid, and aminododecanoic acid. The film sealant of the present invention may cover (or overlay) both sides of the device, and is useful for covering (or overlaying) one side of the device.

The present invention also includes a lamination film which comprises the film sealant and a protective layer laminated to one side of the film sealant and comprising a heat-resistant resin. For example, the lamination film may comprise the film sealant and the protective layer formed directly on one side of the film sealant or formed through an adhesive layer (an intermediate layer). The heat-resistant resin may have a melting point or softening point of not lower than 170° C. The heat-resistant resin may comprise at least one member selected from the group consisting of a polyester-series resin, a polyamide-series resin, and a fluorine-containing resin. The lamination film may have a total thickness of about 10 to 1000 μm.

A process according to the present invention produces a device covered (or overlaid) or molded with a copolyamide-series resin by covering (or overlaying) at least a region (or a portion) of the device with the film sealant, heat-melting the film sealant, and cooling the film sealant. In the process of the present invention, one side of the device may be covered (or overlaid). Thus, the present invention also includes a device (a covered or molded device) of which at least a region (or a portion) is covered or molded with a copolyamide-series resin layer, the layer being formed by heat-melting the film sealant on the device.

Furthermore, in the process of the present invention, at least a region of the device may be covered with the lamination film with the film sealant of the lamination film facing to the device. Thus, the present invention also includes a device (a covered device) of which at least a region is covered or molded with a copolyamide-series resin layer formed by thermal adhesion of the film sealant constituting the lamination film.

Throughout this description, the term "copolyamide-series resin" means not only a copolymer (a copolyamide) of a plurality of amide-forming components, each forming a homopolyamide, but also a mixture of a plurality of copolymers (copolyamides) with different in kind, each containing units of a plurality of the amide-forming components.

Effects of the Invention

According to the present invention, the film sealant comprising a copolyamide-series resin can tightly (or closely) seal an electronic device at a low temperature and does not deteriorate the reliability of the device. Moreover, since the film sealant can thermally adhere to a device at a low temperature, the tight sealing with high adhesion can be achieved in even only one side of the device. Further, the film sealant can effectively protect an electronic device against moisture, dust, impact, or others. A multilayer comprising the film sealant and a protective layer which comprises a heat-resistant resin and is laminated over one side of the sealant can improve the ability to seal an electronic device (or seal-ability), and in addition, the heat resistance and the chemical resistance.

DESCRIPTION OF EMBODIMENTS

The film sealant (or sheet sealant) of the present invention comprises a copolyamide-series resin. The copolyamide-series resin includes a copolyamide (a thermoplastic copolyamide) and a polyamide elastomer.

The thermoplastic copolyamide may be an alicyclic copolyamide and usually an aliphatic copolyamide. The copolyamide may be formed by combination of a diamine component, a dicarboxylic acid component, a lactam component, and an aminocarboxylic acid component. The combination of the diamine component and the dicarboxylic acid component forms an amide bond of the copolyamide; each of the lactam component and the aminocarboxylic acid component can independently form an amide bond of the copolyamide. From these viewpoints, the copolyamide can be obtained by copolymerization of a plurality of amide-forming components selected from the group consisting of a pair of components (combination of a diamine component and a dicarboxylic acid component), a lactam component, and an aminocarboxylic acid component. Moreover, the copolyamide can be obtained by copolymerization of at least one amide-forming component selected from the group consisting of a pair of components (combination of a diamine component and a dicarboxylic acid component), a lactam component and an aminocarboxylic acid component, and another amide-forming component different in kind from the above amide-forming component (or being the same kind as the above amide-forming component but different in the carbon number from the above amide-forming component). Moreover, the lactam component and the aminocarboxylic acid component may be presumed as an equivalent component as far as these components have the same carbon number and chain structure such as a branched structure. Thus, assuming that the pair of components composed of the diamine component and the dicarboxylic acid component is a first amide-forming component and that at least one of the lactam component and the aminocarboxylic acid component is a second amide-forming component, the copolyamide may for example be the following: a copolyamide of the first amide-forming component (the diamine component and the dicarboxylic acid component), wherein at least one of the diamine component and the dicarboxylic acid component comprises a plurality of components with different carbon number; a copolyamide of the first amide-forming component (the diamine component and the dicarboxylic acid component) and the second amide-forming component (at least one component selected from the group consisting of the lactam component and the aminocarboxylic acid component); a copolyamide of the second amide-forming component (at least one component selected from the group consisting of the lactam component and the aminocarboxylic acid component), wherein one of the lactam component and the aminocarboxylic acid component comprises a plurality of components with different carbon number; and a copolyamide of the lactam component and the aminocarboxylic acid component, wherein these components are the same or different in the carbon number from each other.

The diamine component may include an aliphatic diamine or alkylenediamine component (for example, a $C_{4-16}$alkylenediamine such as tetramethylenediamine, hexamethylenediamine, trimethylhexamethylenediamine, octamethylenediamine, or dodecanediamine), and others. These diamine components may be used singly or in combination. The preferred diamine component contains at least an alkylenediamine (preferably a $C_{6-14}$alkylenediamine, more preferably a $C_{6-12}$alkylenediamine).

If necessary, the diamine component may further contains an alicyclic diamine component {for example, a diaminocycloalkane such as diaminocyclohexane (e.g., a diamino$C_{5-10}$cycloalkane); a bis(aminocycloalkyl)alkane [e.g., a bis(amino$C_{5-8}$cycloalkyl)$C_{1-3}$alkane] such as bis(4-aminocyclohexyl)methane, bis(4-amino-3-methylcyclohexyl) methane, or 2,2-bis(4'-aminocyclohexyl)propane; a hydrogenated xylylenediamine} or an aromatic diamine component (e.g., m-xylylenediamine). The above diamine component (for example, an alicyclic diamine component) may have a substituent such as an alkyl group (a $C_{1-4}$alkyl group such as methyl group or ethyl group).

The proportion of the alkylenediamine component in the total diamine component may be about 50 to 100% by mol, preferably about 60 to 100% by mol (e.g., about 70 to 97% by mol), and more preferably about 75 to 100% by mol (e.g., about 80 to 95% by mol).

The dicarboxylic acid component may include an aliphatic dicarboxylic acid or alkanedicarboxylic acid component [for example, a dicarboxylic acid having about 4 to 36 carbon atoms or a $C_{4-36}$alkanedicarboxylic acid (such as adipic acid, pimelic acid, azelaic acid, sebacic acid, dodecanedioic acid, dimer acid or a hydrogenated product thereof)]. These dicarboxylic acid components may be used singly or in combination. The preferred dicarboxylic acid component contains a $C_{6-36}$alkanedicarboxylic acid (for example, a $C_{6-16}$alkanedicarboxylic acid, preferably a $C_{8-14}$alkanedicarboxylic acid). If necessary, the dicarboxylic acid component may further contains an alicyclic dicarboxylic acid component (for example, a $C_{5-10}$cycloalkane-dicarboxylic acid such as cyclohexane-1,4-dicarboxylic acid or cyclohexane-1,3-dicarboxylic acid) or an aromatic dicarboxylic acid (such as terephthalic acid or isophthalic acid). An alicyclic polyamide resin obtained from the alicyclic diamine component and/or the alicyclic dicarboxylic acid component in combination with the aliphatic diamine component and/or the aliphatic dicarboxylic acid component, as the diamine component and the dicarboxylic acid component, is known as a transparent polyamide having a high transparency.

The proportion of the alkanedicarboxylic acid component in the total dicarboxylic acid component may be about 50 to 100% by mol, preferably about 60 to 100% by mol (e.g., about 70 to 97% by mol), and more preferably about 75 to 100% by mol (e.g., about 80 to 95% by mol).

In the first amide-forming component, the diamine component can be used in the range of about 0.8 to 1.2 mol and preferably about 0.9 to 1.1 mol relative to 1 mol of the dicarboxylic acid component.

The lactam component may include, for example, a $C_{4-20}$lactam such as δ-valerolactam, ε-caprolactam, ω-heptalactam, ω-octalactam, ω-decanelactam, ω-undecanelactam, or ω-laurolactam (or ω-laurinlactam). The aminocarboxylic acid component may include, for example, a $C_{6-20}$aminocarboxylic acid such as ω-aminodecanoic acid, ω-aminoundecanoic acid, or ω-aminododecanoic acid. These lactam components and aminocarboxylic acid components may also be used singly or in combination.

The preferred lactam component contains a $C_{6-19}$lactam, preferably a $C_{8-17}$lactam, and more preferably a $C_{10-15}$lactam (e.g., laurolactam). Moreover, the preferred aminocarboxylic acid contains an amino$C_{6-19}$alkanecarboxylic acid, preferably an amino$C_{8-17}$alkanecarboxylic acid, and more preferably an amino$C_{10-15}$alkanecarboxylic acid (such as aminoundecanoic acid or aminododecanoic acid).

The copolyamide may be a modified polyamide such as a polyamine having a branched chain structure formed by introduction of a small amount of a polycarboxylic acid component and/or a polyamine component.

The ratio (molar ratio) of the first amide-forming component (combination of both the diamine component and the dicarboxylic acid component) relative to the second amide-forming component (at least one amide-forming component selected from the group consisting of the lactam component and the aminocarboxylic acid component) can be selected from the range of 100/0 to 0/100 in a ratio of the former/the latter, and may for example be about 90/10 to 0/100 (e.g., about 80/20 to 5/95), preferably about 75/25 to 10/90 (e.g., about 70/30 to 15/85), and more preferably about 60/40 to 20/80 in a ratio of the former/the latter.

Further, the copolyamide preferably contains a long-chain component having a long fatty chain [a higher (or long-chain) alkylene group or alkenylene group] as a polymer unit (or contains a unit derived from the long-chain component). The long-chain component may include a component having a long fatty chain or alkylene group with about 8 to 36 carbon atoms (preferably a $C_{8-16}$alkylene group, and more preferably a $C_{10-14}$alkylene group). As the long-chain component, for example, there may be mentioned at least one component selected from the group consisting of a $C_{8-18}$alkanedicarboxylic acid (e.g., preferably a $C_{10-16}$alkanedicarboxylic acid, and more preferably a $C_{10-14}$alkanedicarboxylic acid), a $C_{9-17}$lactam (preferably a $C_{11-15}$lactam such as laurolactam), and an amino$C_{9-17}$alkanecarboxylic acid (preferably an amino$C_{11-15}$alkanecarboxylic acid such as aminoundecanoic acid or aminododecanoic acid). These long-chain components may be used singly or in combination. Among these long-chain components, a practically used component includes the lactam component and/or the aminoalkanecarboxylic acid component, for example, at least one component selected from the group consisting of laurolactam, aminoundecanoic acid, and aminododecanoic acid. The copolyamide containing a unit derived from the long-chain component has high water resistance as well as excellent adhesion to an electronic device, excellent abrasion resistance, and excellent impact resistance, and therefore protects an electronic device effectively.

The proportion of the long-chain component in the total monomer components for forming the copolyamide may be about 10 to 100% by mol (e.g., about 25 to 95% by mol), preferably about 30 to 90% by mol (e.g., about 40 to 85% by mol), and more preferably about 50 to 80% by mol (e.g., about 55 to 75% by mol).

Further, the copolyamide may be a multiple copolymer of the above amide-forming components, for example, any one of a binary copolymer to a quinary copolymer. The copolyamide is usually any one of a binary copolymer to a quaternary copolymer, and particularly a binary copolymer or a ternary copolymer.

The copolyamide practically contains, for example, an amide-forming component for forming a polyamide selected from the group consisting of a polyamide 11, a polyamide 12, a polyamide 610, a polyamide 612, and a polyamide 1010 as a constitutional unit (or contains a unit derived from the above amide-forming component). The copolyamide may be a copolymer of a plurality of the amide-forming components or may be a copolymer of one or a plurality of the amide-forming components and another amide-forming component (e.g., at least one amide-forming component for forming a polyamide selected from the group consisting of a polyamide 6 and a polyamide 66). Specifically, the copolyamide includes, for example, a copolyamide 6/11, a copolyamide 6/12, a copolyamide 66/11, a copolyamide 66/12, a copolyamide 610/11, a copolyamide 612/11, a copolyamide 610/12, a copolyamide 612/12, a copolyamide 1010/12, a copolyamide 6/11/610, a copolyamide 6/11/612, a copolyamide 6/12/610, and a copolyamide 6/12/612. In these copolyamides, each component separated by the slash "/" indicates an amide-forming component.

As the polyamide elastomer (polyamide block copolymer), there may be mentioned a polyamide block copolymer composed of a polyamide as a hard segment (or a hard block) and a soft segment (or a soft block), for example, a polyamide-polyether block copolymer, a polyamide-polyester block copolymer, and a polyamide-polycarbonate block copolymer.

The polyamide constituting the hard segment may be a homo- or co-polymer (a homopolyamide or a copolyamide) formed by one or a plurality of the above amide-forming components. The homopolyamide as the hard segment may contain the above-exemplified long-chain component as a constitutional unit. The preferred long-chain component includes the same as one described above. A representative homopolyamide includes a polyamide 11, a polyamide 12, a polyamide 610, a polyamide 612, a polyamide 1010, a polyamide 1012, and others. Moreover, the copolyamide as the hard segment includes the same as the above-exemplified copolyamide. Among these polyamides, the preferred polyamide includes a homopolyamide (such as a polyamide 11, a polyamide 12, a polyamide 1010, or a polyamide 1012).

A representative polyamide elastomer includes a polyamide-polyether block copolymer. In the polyamide-polyether block copolymer, the polyether (polyether block) may include, for example, a poly(alkylene glycol) [e.g., a poly($C_{2-6}$ alkylene glycol), preferably a poly($C_{2-4}$alkylene glycol), such as a poly(ethylene glycol), a poly(propylene glycol), or a poly(tetramethylene glycol)].

As examples of the polyamide-polyether block copolymer, there may be mentioned a block copolymer obtainable by copolycondensation of a polyamide block having a reactive terminal group and a polyether block having a reactive terminal group, for example, a polyetheramide [e.g., a block copolymer of a polyamide block having a diamine end and a poly (alkylene glycol) block (or a polyoxyalkylene block) having a dicarboxyl end, and a block copolymer of a polyamide block having a dicarboxyl end and a poly (alkylene glycol) block (or a polyoxyalkylene block) having a diamine end]; and a polyetheresteramide [e.g., a block copolymer of a polyamide block having a dicarboxyl end and a poly(alkylene glycol) block (or a polyoxyalkylene block) having a dihydroxy end]. The polyamide elastomer may have an ester bond. In order to improve the acid resistance, the polyamide elastomer may be free from an ester bond. Moreover, a commercially available polyamide elastomer usually has no or few amino group.

In the polyamide elastomer (the polyamide block copolymer), the number average molecular weight of the soft segment (e.g., a polyether block, a polyester block, and a polycarbonate block) may be selected from the range of, e.g., about 100 to 10000, and may be preferably about 300 to 6000 (e.g., about 300 to 5000), more preferably about 500 to 4000 (e.g., about 500 to 3000), and particularly about 1000 to 2000.

Moreover, in the polyamide elastomer (the polyamide block copolymer), the ratio (weight ratio) of the polyamide block (polyamide segment) relative to the soft segment block may for example be about 75/25 to 10/90, preferably about 70/30 to 15/85, and more preferably about 60/40 to 20/80 (e.g., about 50/50 to 25/75) in a ratio of the former/the latter.

These copolyamide-series resins may be used singly or in combination. Among these copolyamide-series resins, in view of the ability to seal an electronic device, the copolyamide (a non-polyamide elastomer or a polyamide random copolymer) is preferred. In particular, it is preferable that the copolyamide contain an amide-forming component derived from a polyamide 12 as a constitutional unit.

The amino group concentration of the copolyamide-series resin is not particularly limited to a specific one, and may for example be about 10 to 300 mmol/kg, preferably about 15 to 280 mmol/kg, and more preferably about 20 to 250 mmol/kg. A high amino group concentration of a copolyamide-series resin improves adhesion while advantageously laminating another layer (e.g., a protective layer as described later) on the film sealant.

The carboxyl group concentration of the copolyamide-series resin is not particularly limited to a specific one, and may for example about 10 to 300 mmol/kg, preferably about 15 to 280 mmol/kg, and more preferably about 20 to 250 mmol/kg. A high carboxyl group concentration of a copolyamide-series resin achieves high heat stability, which is advantageous in the respect of long-term stability (continuous workability).

The number average molecular weight of the copolyamide-series resin can be selected from the range of, e.g., about 5000 to 200000; and may for example be about 6000 to 100000, preferably about 7000 to 70000 (e.g., about 7000 to 15000), and more preferably about 8000 to 40000 (e.g., about 8000 to 12000); and is usually about 8000 to 30000. The molecular weight of the copolyamide-series resin can be measured by gel permeation chromatography using HFIP (hexafluoroisopropanol) as a solvent in terms of poly(methyl methacrylate).

The amide bond content per molecule of the copolyamide-series resin can be selected from the range of, for example, not more than 100 units. In respect of the ability to seal a device, the amide bond content may be about 30 to 90 units, preferably about 40 to 80 units, and more preferably about 50 to 70 units (e.g., about 55 to 60 units). The amide bond content can be calculated, for example, by dividing a number average molecular weight by a molecular weight of a repeating unit (1 unit).

The copolyamide-series resin may be amorphous (or non-crystalline) or may be crystalline. The copolyamide-series resin may have a degree of crystallinity of, for example, not more than 20% and preferably not more than 10%. The degree of crystallinity can be measured by a conventional method, for example, a measuring method based on density or heat of fusion, an X-ray diffraction method, and an absorption of infrared rays.

The thermal melting property of the amorphous copolyamide-series resin can be determined based on a softening temperature measured by a differential scanning calorimeter. The melting point of the crystalline copolyamide-series resin can be measured by a differential scanning calorimeter (DSC).

The copolyamide-series resin (or the copolyamide or the polyamide elastomer) may have a melting point or softening point of about 75 to 160° C. (e.g., about 80 to 150° C.), preferably about 90 to 140° C. (e.g., about 95 to 135° C.), and more preferably about 100 to 130° C.; and is usually about 90 to 160° C. (e.g., about 100 to 150° C.). Because the copolyamide-series resin has a low melting point or softening point, the melted or molten resin is useful to follow an external shape (or a surface) of a device [e.g., an uneven surface of a device (such as a corner region forming a stepped section)]. When the copolyamide-series resin contains components compatible with each other to show a single peak by DSC, the melting point of the copolyamide-series resin means a temperature at the single peak; when the copolyamide-series resin contains components incompatible with each other to show a plurality of peaks by DSC, the melting point of the copolyamide-series resin means the highest temperature out of a plurality of temperature values showing the peaks.

The copolyamide-series resin preferably has a high melting flowability in order to follow an external shape (or surface) of a device (such as an uneven surface of a device) and to allow the copolyamide-series resin to flow or enter in a gap (or a space) or other areas. The copolyamide-series resin may have a melt flow rate (MFR) of about 1 to 350 g/10 minutes, preferably about 3 to 300 g/10 minutes, and more preferably about 5 to 250 g/10 minutes at a temperature of 160° C. under a load of 2.16 kg.

To the copolyamide-series resin, a homopolyamide (for example, a homopolyamide of a component for forming the copolyamide) may be added as far as the copolyamide-series resin deteriorates its characteristics such as adhesion. The ratio of the homopolyamide may be not more than 30 parts by weight (e.g., about 1 to 25 parts by weight), preferably about 2 to 20 parts by weight, and more preferably about 3 to 15 parts by weight relative to 100 parts by weight of the copolyamide-series resin. In the case where the copolyamide-series resin is a mixture, each polyamide may have compatibility with each other.

It is sufficient that the film sealant (or sheet sealant) comprises a copolyamide-series resin. If necessary, the film sealant may comprise another thermoplastic resin, for example, an ethylene-vinyl acetate copolymer. The ratio of another resin relative to 100 parts by weight of the copolyamide-series resin may for example be not more than 100 parts by weight (e.g., about 1 to 80 parts by weight), preferably about 2 to 70 parts by weight, more preferably about 2 to 50 parts by weight, and particularly not more than 30 parts by weight (e.g., about 3 to 20 parts by weight).

If necessary, the copolyamide-series resin may contain various additives, for example, a filler, a stabilizer (such as a heat stabilizer or a weather-resistant stabilizer), a coloring agent, a plasticizer, a lubricant, a flame retardant, an antistatic agent, and a thermal conductive agent. The additives may be used alone or in combination. Among these additives, an additive such as the stabilizer or the thermal conductive agent is widely used.

As described above, the film sealant of the present invention may be a film comprising a copolyamide-series resin, a mixture of a plurality of copolyamide-series resins, or a mixture (a copolyamide-series resin composition) containing a copolyamide-series resin and another component (e.g., a homopolyamide, an additive).

The film sealant (or sheet sealant) may be a non-stretched film or a stretched (uniaxially or biaxially stretched) film. Thermal contraction property may be imparted to the film sealant by stretching (or drawing) or orientation. The stretching ratio of the film at one direction may for example be about 1.2 to 10 (preferably about 1.5 to 7, and more preferably about 2 to 5).

The film sealant may have a thickness selected from, e.g., the range of about 1 to 1000 μm, and may usually have a thickness of about 5 to 500 μm (e.g., about 5 to 300 μm), preferably about 10 to 250 μm (e.g., about 25 to 200 μm), and more preferably about 50 to 200 μm (e.g., about 75 to 150 μm). A too thin film sealant practically fails to cover an angular region or the like sufficiently. A too thick film sealant hardly follows an uneven external shape (or surface) of a device.

The film sealant may have a water (or moisture) vapor transmission rate (40° C., 90% RH) in terms of 1 mm thick of, for example, not more than 100 $g/m^2/day$ and preferably not more than 50 $g/m^2/day$ (e.g., about 0.01 to 30 $g/m^2/day$). In particular, the film sealant comprising the copolyamide has excellent barrier properties against water vapor; and has the above-mentioned water vapor transmission rate in terms of 1 mm thick is, for example, about 0.01 to 2 $g/m^2/day$, preferably about 0.05 to 1.5 $g/m^2/day$, and more preferably about 0.1 to 1 $g/m^2/day$. The water vapor transmission rate can be measured according to a conventional method, for example, dish method of JIS (Japanese Industrial Standards) Z0208.

The film sealant can be produced by a conventional film-forming method, for example, flow-casting, extrusion molding, and blow molding. If necessary, the film sealant may be stretched at a predetermined stretching ratio using a uniaxially or biaxially stretching machine.

The film sealant may be in the form of one sheet, in the form of a folded sheet capable of holding or wrapping a device, in the form of a bag capable of storing a device, or other forms.

Moreover, the film sealant may form a lamination film (a lamination sheet) or a multilayer film (a multilayer sheet). The lamination film is not particularly limited to a specific one as far as the lamination film comprises at least the film sealant (a sealant layer comprising the copolyamide-series resin). For example, the lamination film comprises the film sealant and a protective layer (a heat-resistant resin layer or a hydrophobic resin layer) which comprises a heat-resistant resin (or a hydrophobic resin) and is laminated to one side of the film sealant (an opposite side to an adhering side to a device). A plurality of protective layers may be laminated to one side of the film sealant. The protective layer(s) is used to protect a device against an external undesired factor (such as heat or moisture). For example, the heat-resistant resin layer can prevent the breakage of the film in the heat-melting process; the hydrophobic resin layer can prevent the corrosion of a device by moisture. Thus, the protective layer can ensure an improved durability of the device.

The heat-resistant resin is not particularly limited to a specific one as far as the resin has a heat resistance enough to outstand or resist the heat-melting temperature of the film sealant. For example, the heat-resistant resin may include a fluorine-containing resin, an olefinic resin (including a cyclic olefinic resin), a styrenic resin, a polyester-series resin, a polycarbonate-series resin, a polyurethane-series resin, a polyamide-series resin, a polyimide-series resin (such as a polyamideimide or a polyetherimide), a polyacetal-series resin, a poly(phenylene ether)-series resin, a polyetherketone-series resin (e.g., a polyetherketone (PEK), a polyetheretherketone (PEEK)), a poly(phenylene sulfide)-series resin, a polyethersulfone-series resin, a cellulose derivative, and an aromatic epoxy resin.

A representative heat-resistant resin includes a polyester-series resin, a polyamide-series resin, a fluorine-containing resin, and others. As the polyester-series resin, for example, there may be mentioned a poly(alkylene arylate)-series resin [for example, a homopolyester (e.g., a poly($C_{2-4}$alkylene arylate) such as a poly(ethylene terephthalate), a poly(butylene terephthalate), or a poly(ethylene naphthalate)) and a copolyester (e.g., a copolyester containing a $C_{2-4}$alkylene arylate unit as a main component)], a polyarylate-series resin, and a liquid crystal polyester.

The polyester-series resin also includes a polyester elastomer. The polyester elastomer (polyester block copolymer) may include a polyester block copolymer comprising an aromatic polyester as a hard segment (or a hard block) and a soft segment (or a soft block), for example, an aromatic polyester-polyether block copolymer and an aromatic polyester-aliphatic polyester block copolymer.

As the aromatic polyester constituting the hard segment, there may be mentioned the above-mentioned poly(alkylene arylate)-series resin [for example, a poly($C_{2-4}$alkylene terephthalate) such as a poly(butylene terephthalate)], and others. The polyether (polyether block) constituting the soft segment may include a polyether as exemplified in the polyamide elastomer [for example, a poly($C_{2-6}$alkylene glycol) such as a poly(tetramethylene glycol)].

For the polyester elastomer, the proportion of the aromatic polyester block (the hard segment) in the whole segment may for example be about 25 to 95% by weight, preferably about 30 to 90% by weight (e.g., about 50 to 85% by weight).

The polyamide-series resin may include the above-mentioned homopolyamide (for example, a polyamide 11, a polyamide 12, a polyamide 610, a polyamide 612, a polyamide 1010, and a polyamide 1012), a copolyamide-series resin different in kind from the copolyamide-series resin contained in the film sealant (e.g., a polyamide elastomer), and others. The polyamide-series resin is usually a polyamide-series resin other than the copolyamide.

As the fluorine-containing resin, there may be mentioned, for example, a homopolymer such as a poly(vinyl fluoride) (PVF), a poly(vinylidene fluoride) (PVDF), a polytrifluoroethylene (PTrFE), a polychlorotrifluoroethylene, or a polytetrafluoroethylene (PTFE), an ethylene-tetrafluoroethylene copolymer (ETFE), an ethylene-chlorotrifluoroethylene copolymer, a tetrafluoroethylene-hexafluoropropylene copolymer, and a tetrafluoroethylene-perfluoropropylvinylether copolymer.

The heat-resistant resin may be a highly hydrophobic resin, for example, an olefinic resin, a styrenic resin, and a fluorine-containing resin.

These heat-resistant resins may be used singly or in combination. Among these heat-resistant resins, the preferred resin includes the polyester-series resin (such as an aromatic polyester), the polycarbonate-series resin, the polyamide-series resin (such as an aromatic polyamide), the poly(phenylene ether)-series resin, the poly(phenylene sulfide)-series resin, the polyimide-series resin, and others. In particular, as the heat-resistant resin, at least one member selected from the group consisting of the polyester-series resin, the polyamide-series resin, and the fluorine-containing resin is widely used.

The heat-resistant resin may have a melting point or softening point of, for example, not lower than 160° C. (e.g., about 165 to 250° C.) and preferably not lower than 170° C. (e.g., about 175 to 220° C.). The melting point or softening point can be measured by a conventional method, for example, a differential scanning calorimeter (DSC).

The heat-resistant resin may have a thermal deformation temperature of, for example, selected from the range of not higher than 160° C. under a condition of a high load (1.82 MPa) in accordance with ISO 75-1, and may have the thermal deformation temperature of about 40 to 155° C. and preferably about 50 to 150° C.

The thickness of the protective layer (in the case where a plurality of protective layers are formed, the thickness means the total thickness of each protective layer) is not particularly limited to a specific one as far as the lamination film can tightly seal a device along an external uneven shape (or a surface) of the device. For example, the thickness of the protective layer may be about 1 to 800 μm (e.g., about 5 to 700 μm), preferably about 10 to 600 μm (e.g., about 20 to 500 μm), and more preferably about 30 to 400 μm (e.g., about 50 to 300 μm). A too thin protective layer easily breaks, causing deterioration of a function as a protective layer. In the case where a plurality of protective layers is formed, each protective layer may have a thickness of, for example, about 1 to 100 μm and preferably about 5 to 50 μm.

There may be an intermediate layer (an adhesive layer) between the film sealant and the protective layer and/or between a plurality of protective layers. The adhesive layer may comprise a conventional adhesive or pressure sensitive adhesive, for example, a vinyl chloride-series adhesive, a vinyl acetate-series adhesive, an olefinic adhesive, an acrylic adhesive, a polyester-series adhesive, a urethane-series adhesive, an epoxy-series adhesive, and a rubber-series adhesive.

The thickness of the adhesive layer is not particularly limited to a specific one, and may for example be about 1 to 50 μm and preferably about 5 to 30 μm.

The lamination structure will be illustrated simply hereinafter with character (or letter) string. If the film sealant is denoted by A, the protective layer is denoted by B or $B_n$ (wherein n is an integer of not less than 1; $B_1$, $B_2$, ... $B_n$ indicate the first, the second, ... the n-th protective layers, respectively) and the adhesive layer is denoted by C (e.g., the lamination structure composed of A and B is written as AB), a representative lamination film having single protective layer includes AB, ACB, and others, and a representative lamination film having a plurality of protective layers includes $AB[(C)_m B]_r$ (wherein m is 0 or 1, and r is an integer of not less than 1) and others. The latter lamination film includes, for example, a three-layer film such as $AB_1B_2$ (m=0, r=1) and a four-layer film such as $AB_1CB_2$ (m=1, r=1) or $AB_1B_2B_3$ (m=0, r=2). Moreover, each protective layer B is usually formed with a different kind of each heat-resistant resin, which may for example be at least one member selected from the group consisting of a polyester-series resin, a polyamide-series resin, and a fluorine-containing resin. When the protective layer comprises a polyamide-series resin, a terminal amino group of the polyamide-series resin can improve adhesion between layers, and a terminal carboxyl group of the polyamide-series resin can improve long-term stability (continuous workability) due to a high thermal stability thereof.

The lamination film may have a total thickness of, for example, about 10 to 1000 μm, preferably about 30 to 800 μm, and more preferably about 50 to 500 μm.

The thickness ratio of the film sealant relative to the protective layer (in the case where a plurality of protective layers and/or adhesive layers are formed, the total thickness of each protective layer and/or adhesive layer is regarded as the thickness of the protective layer) may be selected from the range of about 95/5 to 5/95 (e.g., about 90/10 to 10/90), and may for example be about 10/90 to 90/10 (e.g., about 10/90 to 80/20), preferably about 15/85 to 70/30 (e.g., about 15/85 to 60/40), and more preferably about 20/80 to 50/50 (e.g., about 20/80 to 40/60) as a ratio of the former/the latter.

The lamination film improves heat resistance and chemical resistance compared with a single-layered (or monolayered) film. For example, the lamination film has a thermal deformation temperature (maximum allowable working temperature) of, for example, about 160 to 300° C., preferably about 170 to 280° C., and more preferably about 180 to 250° C. Moreover, assuming that the single-layered film has a thermal deformation temperature of 100, the lamination film has a thermal deformation temperature of, for example, about 120 to 200, preferably about 125 to 180, and more preferably about 130 to 160. The thermal deformation temperature means a minimum temperature at which the film is deformed by thermal treatment for 15 seconds.

Moreover, the lamination film improves chemical resistance to each of an organic component (for example, an aliphatic hydrocarbon, an aromatic hydrocarbon, an alcohol, and a ketone) and an inorganic component (for example, an inorganic acid such as hydrochloric acid), and in particular, improves chemical resistance to an alcohol (such as methanol).

The lamination film (laminate) can be prepared by laminating the film sealant and the protective layer according to a conventional manner. As the method, there may be mentioned a conventional method, for example, lamination (such as heat lamination or dry lamination), co-extrusion using a general-purpose die equipped with a feed block or a multi-manifold die, and coating.

Use of the film sealant (or sheet sealant) shortens sealing and molding cycles compared with a thermosetting resin. Moreover, in an injection molding (in particular, a low-pressure injection molding) or a molding of a hot-melt resin, there is a limitation in the size of a device or substrate in connection with a mold, and only a device or substrate having a size of about 10×10 cm² at the most can be sealed. In contrast, the film sealant can seal a device without limitation in size. In addition, differently from the injection molding or the molding of the hot-melt resin, the film sealant even in a thin layer form surely molds to a device and thus can be lightweight and small-sized. Moreover, the film sealant ensures covering or molding of only a certain region of a device with high adhesion and high seal-ability. Further, use of the lamination film composed of the film sealant and the protective layer formed with the heat-resistant resin prevents breakage in the heat-melting process to improve a sealing performance for the device. Thus, the lamination film can thermally adhere to an electronic device or the like to cover (or mold) the device, thereby protecting the electronic device against water, moisture, contamination due to adhesion of dust, and others. In particular, even if the film sealant is applied to only a partial region of a device, the film sealant containing a copolyamide-series resin improves adhesion to the device, imparts a high impact resistance and abrasion resistance to the device, and improves a protective effect relative to the device. Thus, the film sealant of the present invention may cover (or wrap) both sides of the device; and if the film sealant covers (or wraps) a certain region of at least one side of the device or one side of the device, the device is protected by the film sealant with high adhesion.

According to the method of the present invention, a device covered (or overlaid) or molded with a copolyamide-series resin can be produced by a step (covering step) for covering at least part (a region) of a device (or an electronic device) with the film sealant, a step for heat-melting the film sealant, and cooling the film sealant.

The device may include various organic or inorganic devices, each requiring molding or sealing, for example, a precision part (e.g., a semiconductor element, an electroluminescent (EL) device, a light emitting diode, and a solar cell) or an electronic part (in particular, a precision electronic part or an electronic device) such as a circuit board (a printed wiring board) equipped or mounted with a part (such as various electronic parts or electronic devices).

In the covering step, it is sufficient to cover at least a region of a device with the film sealant (or sheet sealant). The whole of the device may be covered (or wrapped); the whole of one side of the device, or a region or a certain region (such as an area equipped with an electronic part or a wiring area) of at least one side of the device may be covered. Covering of one side of the device (including an equipped or mounted region) with the film sealant and heat-melting of the sealant tightly covers (or coats) or molds over all of one side of the device with the copolyamide-series resin to protect the device effectively. Further, the film may be softened by heating to veil or cover over the device. Furthermore, after covering the device with the film sealant (for example, a film sealant softened by heating), the film may be closely contacted with the device by discharging air therebetween under a reduced pressure.

In the heating step, the copolyamide-series resin adheres (or melt-adheres) to the device by heat-melting the sealant depending on the heat resistance of the device. The heating temperature may for example be about 75 to 200° C., preferably about 80 to 180° C., and more preferably about 100 to 175° C. (e.g., about 110 to 150° C.) depending on the melting point or softening point of the copolyamide-series resin. For the lamination film, the heating temperature is preferably not lower than the melting point (for example, 5° C. or more higher than the melting point, and preferably 10° C. or more higher than the melting point) of the copolyamide-series resin and 10° C. or less higher than the melting point (for example, 5° C. or less higher than the melting point, and preferably less than the melting point) of the heat-resistant resin forming the protective layer. Moreover, the heating temperature is usually not lower than the glass transition temperature (preferably, not lower than the thermal deformation temperature) of the heat-resistant resin forming the protective layer. The heating can be carried out in air or in an inert gas atmosphere. The heating can be conducted in an oven, and if necessary, may use ultrasonic heating or high-frequency heating (electromagnetic heating). The heat-melting step may be carried out under an atmospheric pressure, an applied pressure, or a reduced pressure. A thermally contractive (or shrinkable) film as the sealant melt-adheres to and tightly seals the device while tightly bonding the whole of the device.

Further, if necessary, the covering step and the heating step may be repeated. Moreover, after a copolyamide-series resin layer is formed on a first side (e.g., an upper surface) of the device as described above, a second side (e.g., a bottom surface) of the device is covered with and melt-adheres to the film sealant for molding and sealing both sides of the device including end faces thereof. In applying the film sealant of the present invention to the first side of the device, the second side of the device may be sealed with another resin, for example, a low-water-absorbing resin such as a polyolefinic resin, a poly(vinyl butyral)-series resin, or a fluorine-containing resin; a highly heat-resistant resin such as an aromatic epoxy resin, an aromatic polyester, or a polyimide. Another resin may be in the form of a liquid, a particulate, a film, or others.

In the cooling step, the molten (or melt-adhered) copolyamide-series resin may be cooled spontaneously, or stepwise or continuously, or rapidly.

By these steps, a device at least a region of which is covered or molded with the copolyamide-series resin layer formed by heat-melting (or thermal adhesion) of the film sealant can be obtained. The molding site of the device is usually a fragile or delicate site, for example, a site equipped with an electronic device and a wiring site.

According to the present invention, since the film sealant can be melted to adhere to the device at a relatively low temperature, the reliability of the device can be improved due to a low thermal damage to the device. Moreover, differently from injection molding or the like, since a high pressure is not applied to the device, the device is not damaged due to a pressure. Thus, the film sealant molds and seals the device with high reliability. In addition, the heating and cooling in a short period of time improves the production of the molded or sealed device greatly.

EXAMPLES

The following examples are intended to describe this invention in further detail and should by no means be interpreted as defining the scope of the invention. The methods of the evaluation of evaluation items in the examples are as follows.

[Sealing Performance]

The sealing performance of a sealant was evaluated for both of a flat surface of a substrate and a protruded portion having a side face (height: 2 mm or 10 mm) rising perpendicularly from a flat surface of a substrate on the basis of the following criteria.

5: The flat surface or the protruded portion is wholly covered with the sealant.
4: The flat surface or the protruded portion is almost wholly covered, but entering of air is partly observed between the substrate and the sealant.
3: Half of the sealant peels off from the flat surface or the protruded portion.
2: The sealant partly adheres to the flat surface or the protruded portion, but the sealant mostly peels off from the flat surface or the protruded portion.
1: The sealant wholly peels off from the flat surface or the protruded portion.

[Peel Test]

A test piece comprising a glass epoxy substrate and a film of Examples and Comparative Examples formed on the substrate was evaluated for the adhesion between the substrate and the film according to a cross-cut test.

[Water-Resistant Test]

A test piece comprising a glass epoxy substrate and a film of Examples and Comparative Examples formed on the substrate was evaluated for the water resistance according to a cross-cut test after being immersed in water of a thermostatic bath at 23° C. for 100 hours.

[Water Vapor Transmission Rate]

Each film of Examples and Comparative Examples was measured for a water vapor transmission rate (40° C., 90% RH, in terms of 1 mm thick) in accordance with dish method of JIS 20208.

[Chemical Resistance]

Each chemical was applied to an upper surface of each film of Examples and Reference Examples, and our hour after each film was evaluated for the chemical resistance according to a cross-cut peel test based on the adhesion strength. Moreover, the external appearance of the coated layer was visually evaluated.

A: There is no change.
B: Partial change is observed.
C: Apparent change is observed.

[Heat Resistance]

Each film of Examples and Reference Examples was placed in an oven at each temperature for 15 seconds, and the heat resistance of the film was evaluated based on a temperature at which the film was deformed (maximum allowable working temperature).

(1) Single Layer Film

Example 1

A film (thickness: 100 μm, size: 200 mm×200 mm) formed with a copolyamide (VESTAMELT X1038p1, containing a $C_{10-14}$alkylene group, melting point: 125° C. (DSC), manufactured by Evonik) was placed on an electronic substrate (200 mm×200 mm) made of a glass epoxy resin, and heated under an atmosphere of a temperature of 170° C. to give a substrate coated with the transparent resin.

Example 2

A film (thickness: 100 μm, size: 200 mm×200 mm) formed with a copolyamide (VESTAMELT X1051, containing a $C_{10-14}$ alkylene group, melting point: 130° C. (DSC), manufactured by Evonik) was placed on an electronic substrate (200 mm×200 mm) made of a glass epoxy resin, and heated under an atmosphere of a temperature of 170° C. to give a substrate coated with the transparent resin.

Example 3

A film (thickness: 100 μm, size: 200 mm×200 mm) formed with a copolyamide (VESTAMELT X1333p1, containing a $C_{10-14}$alkylene group, melting point: 105° C. (DSC), manufactured by Evonik) was placed on an electronic substrate (200 mm×200 mm) made of a glass epoxy resin, and heated under an atmosphere of a temperature of 170° C. to give a substrate coated with the transparent resin.

Example 4

A film (thickness: 100 μm, size: 200 mm×200 mm) formed with a copolyamide (VESTAMELT 4680, containing a $C_{10-14}$alkylene group, melting point: 105° C. (DSC), manufactured by Evonik) was placed on an electronic substrate (200 mm×200 mm) made of a glass epoxy resin, and heated under an atmosphere of a temperature of 170° C. to give a substrate coated with the transparent resin.

Example 5

A film (thickness: 100 μm, size: 200 mm×200 mm) formed with a copolyamide (VESTAMELT X7079, containing a $C_{10-14}$alkylene group, melting point: 130° C. (DSC), manufactured by Evonik) was placed on an electronic substrate (200 mm×200 mm) made of a glass epoxy resin, and heated under an atmosphere of a temperature of 170° C. to give a substrate coated with the transparent resin.

Example 6

A film (thickness: 100 μm, size: 200 mm×200 mm) formed with a copolyamide (DAIAMID Z1117, containing a $C_{10-14}$alkylene group, melting point: 130° C. (DSC), manufactured by Daicel-Evonik Ltd.) which is compounded Z1038/Z2131 (Z1038/Z2131=1/1) by a biaxial extruder was placed on an electronic substrate (200 mm×200 mm) made of a glass epoxy resin, and heated under an atmosphere of a temperature of 170° C. to give a substrate coated with the transparent resin.

Example 7

An electronic substrate (200 mm×200 mm) made of a glass epoxy resin, having an electronic part (height: 20 mm) mounted thereon was heated at 170° C. for 2 minutes. Then, a film of a copolyamide (VESTAMELT X1038p1, containing a $C_{10-14}$alkylene group, melting point: 125° C. (DSC), manufactured by Evonik) was placed on the electronic substrate, and heated for 2 minutes under an atmosphere of a temperature of 170° C. to give a mounted substrate (including the electronic part) coated with the transparent resin.

Comparative Example 1

A film (thickness: 100 μm, size: 200 mm×200 mm) formed with a polyamide 12 (DAIAMID L1840, melting point: 178° C. (DSC), manufactured by Daicel-Evonik Ltd.) was placed on an electronic substrate (200 mm×200 mm) made of a glass epoxy resin, and heated under an atmosphere of a temperature of 220° C. to give a substrate coated with the transparent resin.

Comparative Example 2

A film (thickness: 100 μm, size: 200 mm×200 mm) formed with a polyethylene (NOVATEC HD, melting point: 132° C. (DSC), manufactured by Mitsubishi Chemical Corporation) was placed on an electronic substrate (200 mm×200 mm) made of a glass epoxy resin, and heated under an atmosphere of a temperature of 160° C. to give a substrate coated with the transparent resin.

Comparative Example 3

A film (thickness: 100 μm, size: 200 mm×200 mm) formed with a polyester elastomer (Hytrel 5557, melting point: 208° C. (DSC), manufactured by Du Pont-Toray Co., Ltd.) was placed on an electronic substrate (200 mm×200 mm) made of a glass epoxy resin, and heated under an atmosphere of a temperature of 230° C. to give a substrate coated with the transparent resin.

Comparative Example 4

An electronic substrate (200 mm×200 mm) made of a glass epoxy resin, having an electronic part (height: 20 mm) mounted thereon was heated at 170° C. for 2 minutes. Then, a film of a polyamide 12 (DAIAMID L1840, melting point: 178° C. (DSC), manufactured by Daicel-Evonik Ltd.) was placed on the electronic substrate, and heated for 2 minutes under an atmosphere of a temperature of 220° C. A uniform coating layer could not be formed.

Each sealant used in Examples and Comparative Examples was evaluated for sealing performance, peeling property, and water resistance. The results are shown in Table 1. In the table, each numerical value in the peel test and the water-resistant test indicates the number of peeled squares out of 100 squares in the cross-cut peel test.

TABLE 1

|  | Examples | | | | | | | Comparative Examples | | | |
| --- | --- | --- | --- | --- | --- | --- | --- | --- | --- | --- | --- |
|  | 1 | 2 | 3 | 4 | 5 | 6 | 7 | 1 | 2 | 3 | 4 |
| Flat | 5 | 5 | 5 | 5 | 5 | 5 | 5 | 5 | 5 | 5 | 1 |
| Protruded portion 2 mm | 5 | 5 | 5 | 5 | 5 | 5 | 5 | 3 | 2 | 4 | 1 |
| Protruded portion 10 mm | 5 | 5 | 5 | 5 | 5 | 5 | 5 | 1 | 1 | 1 | 1 |
| Peel test | 0 | 0 | 0 | 1 | 2 | 0 | 0 | 100 | 100 | 98 | — |
| Water-resistant test | 0 | 0 | 0 | 1 | 2 | 0 | 0 | 100 | 100 | 100 | — |
| Water vapor transmission rate (g/m$^2$/day) | 0.7 | 0.7 | 0.7 | 0.7 | 0.7 | 0.7 | 0.7 | 2.2 | — | — | — |

As apparent from Table 1, compared with Comparative Examples, Examples show high sealing performance in both of the flat portion and the protruded portion, have excellent adhesion and water resistance as well as also have excellent barrier properties against water vapor.

(2) Lamination Film

Example 8

A lamination film (size: 200 mm×200 mm) was prepared by laminating a first layer (thickness: 100 μm) formed with a copolyamide (VESTAMELT X1038, containing a $C_{10-14}$ alkylene group, melting point: 125° C. (DSC), manufactured by Evonik) and a second layer (thickness: 200 μm) formed with a polyamide 12 (DAIAMID L1940, melting point: 178° C. (DSC), manufactured by Daicel-Evonik Ltd.) on one side of the first layer. The lamination film was placed on an electronic substrate (200 mm×200 mm) made of a glass epoxy resin with the first layer facing to the electronic substrate, and heated under an atmosphere of a temperature of 170° C. to give a substrate coated with the transparent resin.

Example 9

A lamination film (size: 200 mm×200 mm) was prepared by laminating a first layer (thickness: 100 μm) formed with a copolyamide (VESTAMELT X1051, containing a $C_{10-14}$ alkylene group, melting point: 130° C. (DSC), manufactured by Evonik) and a second layer (thickness: 200 μm) formed with a polyamide 12 (DAIAMID L1940) on one side of the first layer. The lamination film was placed on an electronic substrate (200 mm×200 mm) made of a glass epoxy resin with the first layer facing to the electronic substrate, and heated under an atmosphere of a temperature of 170° C. to give a substrate coated with the transparent resin.

Example 10

A lamination film (size: 200 mm×200 mm) was prepared by laminating a first layer (thickness: 100 μm) formed with a copolyamide (VESTAMELT X1331, containing a $C_{1-14}$ alkylene group, melting point: 105° C. (DSC), manufactured by Evonik) and a second layer (thickness: 200 μm) formed with a polyamide 12 (DAIAMID L1940) on one side of the first layer. The lamination film was placed on an electronic substrate (200 mm×200 mm) made of a glass epoxy resin with the first layer facing to the electronic substrate, and heated under an atmosphere of a temperature of 170° C. to give a substrate coated with the transparent resin.

Example 11

A lamination film (size: 200 mm×200 mm) was prepared by laminating a first layer (thickness: 100 μm) formed with a copolyamide (VESTAMELT X1051) and a second layer (thickness: 200 μm) formed with a polyamide 610 (VESTAMID Tera DS16, melting point: 225° C., manufactured by Evonik) on one side of the first layer. The lamination film was placed on an electronic substrate (200 mm×200 mm) made of a glass epoxy resin with the first layer facing to the electronic substrate, and heated under an atmosphere of a temperature of 210° C. to give a substrate coated with the transparent resin.

Example 12

A lamination film (size: 200 mm×200 mm) was prepared by laminating a first layer (thickness: 100 μm) formed with a copolyamide (VESTAMELT X1051) and a second layer (thickness: 200 μm) formed with a polyamide 612 (DAIAMID D1840, melting point: 215° C. (DSC), manufactured by Daicel-Evonik Ltd.) on one side of the first layer. The lamination film was placed on an electronic substrate (200 mm×200 mm) made of a glass epoxy resin with the first layer facing to the electronic substrate, and heated under an atmosphere of a temperature of 200° C. to give a substrate coated with the transparent resin.

Example 13

A lamination film (size: 200 mm×200 mm) was prepared by laminating a first layer (thickness: 100 μm) formed with a copolyamide (VESTAMELT X1051) and a second layer (thickness: 200 μm) formed with a polyamide elastomer (DAIAMID X4442, containing an ester bond, melting point: 175° C. (DSC), manufactured by Daicel-Evonik Ltd.) on one side of the first layer. The lamination film was placed on an electronic substrate (200 mm×200 mm) made of a glass epoxy resin with the first layer facing to the electronic substrate, and heated under an atmosphere of a temperature of 175° C. to give a substrate coated with the transparent resin.

Example 14

A lamination film (size: 200 mm×200 mm) was prepared by laminating a first layer (thickness: 100 μm) formed with a copolyamide (VESTAMELT X1051) and a second layer (thickness 200 μm) formed with a polyamide elastomer (VESTAMID BS0910, not containing an ester bond, melting point: 166° C. (DSC), manufactured by Evonik) on one side of the first layer. The lamination film was placed on an electronic substrate (200 mm×200 mm) made of a glass epoxy resin with the first layer facing to the electronic substrate, and heated under an atmosphere of a temperature of 165° C. to give a substrate coated with the transparent resin.

Example 15

A lamination film (size: 200 mm×200 mm) was prepared by laminating a first layer (thickness: 100 μm) formed with a copolyamide (VESTAMELT X1038) and a second layer (thickness: 200 μm) formed with an ETFE (EP7000, an ethylene-tetrafluoroethylene copolymer, manufactured by manufactured by Daikin Industries Ltd.) on one side of the first layer. The lamination film was placed on an electronic substrate (200 mm×200 mm) made of a glass epoxy resin with the first layer facing to the electronic substrate, and heated under an atmosphere of a temperature of 170° C. to give a substrate coated with the transparent resin.

Example 16

A lamination film (size: 200 mm×200 mm) was prepared by laminating a first layer (thickness: 100 μm) formed with a copolyamide (VESTAMELT X1038) and a second layer (thickness: 200 μm) formed with a thermoplastic polyester elastomer (Hytrel 5557, melting point: 208° C. (DSC), manufactured by Du Pont-Toray Co., Ltd.) on one side of the first layer. The lamination film was placed on an electronic substrate (200 mm×200 mm) made of a glass epoxy resin with the first layer facing to the electronic substrate, and heated under an atmosphere of a temperature of 170° C. to give a substrate coated with the transparent resin.

Example 17

A lamination film (size: 200 mm×200 mm) was prepared by laminating a first layer (thickness: 100 μm) formed with a copolyamide (VESTAMELT X1038), a second layer (thickness: 200 μm) formed with a thermoplastic polyester elastomer (Hytrel 5557), and a third layer (thickness 100 μm) formed with an ETFE (EP7000) in this order. The lamination film was placed on an electronic substrate (200 mm×200 mm) made of a glass epoxy resin with the first layer facing to the electronic substrate, and heated under an atmosphere of a temperature of 170° C. to give a substrate coated with the transparent resin.

Reference Example 1

A film (thickness: 300 μm, size: 200 mm×200 mm) formed with a copolyamide (VESTAMELT X1038) was placed on an electronic substrate (200 mm×200 mm) made of a glass epoxy resin, and heated under an atmosphere of a temperature of 170° C. to give a substrate coated with the transparent resin.

Reference Example 2

A film (thickness: 300 μm, size: 200 mm×200 mm) formed with a copolyamide (VESTAMELT X1051) was placed on an electronic substrate (200 mm×200 mm) made of a glass epoxy resin, and heated under an atmosphere of a temperature of 170° C. to give a substrate coated with the transparent resin.

TABLE 2

| | | Examples | | | | | | | | | | Reference Examples | |
|---|---|---|---|---|---|---|---|---|---|---|---|---|---|
| | | 8 | 9 | 10 | 11 | 12 | 13 | 14 | 15 | 16 | 17 | 1 | 2 |
| Sealing performance | Flat | 5 | 5 | 5 | 5 | 5 | 5 | 5 | 5 | 5 | 5 | 5 | 5 |
| | Protruded portion 2 mm | 5 | 5 | 5 | 5 | 5 | 5 | 5 | 5 | 5 | 5 | 5 | 5 |
| | Protruded portion 10 mm | 5 | 5 | 5 | 5 | 5 | 5 | 5 | 5 | 5 | 5 | 5 | 5 |
| Peeled squares | Methanol | 100 | 100 | 100 | 100 | 100 | 100 | 100 | 100 | 100 | 100 | 0 | 0 |
| | Toluene | 100 | 100 | 100 | 100 | 100 | 100 | 100 | 100 | 100 | 100 | 100 | 100 |
| | Acetone | 100 | 100 | 100 | 100 | 100 | 100 | 100 | 100 | 100 | 100 | 95 | 90 |
| | Hexane | 100 | 100 | 100 | 100 | 100 | 100 | 100 | 100 | 100 | 100 | 100 | 100 |
| | Isooctane | 100 | 100 | 100 | 100 | 100 | 100 | 100 | 100 | 100 | 100 | 100 | 100 |
| | 10% Hydrochloric acid | 100 | 100 | 100 | 100 | 100 | 100 | 100 | 100 | 70 | 100 | 10 | 15 |
| Coated state | Methanol | A | A | A | A | A | A | A | A | A | A | C | C |
| | Toluene | A | A | A | A | A | A | A | A | A | A | A | A |
| | Acetone | A | A | A | A | A | A | A | A | A | A | B | B |
| | Hexane | A | A | A | A | A | A | A | A | A | A | A | A |
| | Isooctane | A | A | A | A | A | A | A | A | A | A | A | A |
| | 10% Hydrochloric acid | A | A | A | A | A | B | A | A | B | A | C | C |
| Heat resistance | | 200° C. | 200° C. | 235° C. | 230° C. | 210° C. | 200° C. | 190° C. | 240° C. | 210° C. | 190° C. | 150° C. | 150° C. |

As apparent from Table 2, the lamination films of Examples have excellent heat resistance compared with the single layer films of Reference Examples, and have 40 to 90° C. higher in maximum allowable working temperature than those of the single layer films of Reference Examples. Moreover, the lamination films of Examples have improved chemical resistance (for example, methanol resistance, acetone resistance, 10% hydrochloric acid resistance, particularly, methanol resistance) compared with the single layer films of Reference Examples.

INDUSTRIAL APPLICABILITY

The present invention is useful for molding or sealing of an electronic device or electronic part (e.g., a semiconductor element, an EL device, and a solar cell) or a printed wiring board equipped with a variety of electronic parts or electronic devices at a low temperature.

The invention claimed is:

1. A process for producing a device covered with a copolyamide-series resin, wherein said device is a semiconductor element, a printed wiring board, or a solar cell, the process comprising:
covering at least a region of the device with a film sealant comprising a crystalline copolyamide-series resin consisting of units each derived from a long-chain component having a $C_{10-14}$ alkylene group, said film having a thickness of 10-250 μm, heat-melting the film sealant at atmospheric pressure, without pressing said device, and cooling the film sealant.

2. A process according to claim 1, wherein one side of the device is covered with the film sealant for producing a covered device of which one side is covered with the copolyamide-series resin.

3. The process according to claim 1, wherein the copolyamide-series resin is a crystalline resin and has a melting point of 90 to 150° C.

4. The process according to claim 1, wherein the copolyamide-series resin is one of a binary copolymer to a quaternary copolymer.

5. The process according to claim 1, wherein the copolyamide-series resin contains a unit derived from at least one component selected from the group consisting of a $C_{11-15}$lactam and an amino$C_{11-15}$alkanecarboxylic acid.

6. The process according to claim 1, wherein the copolyamide-series resin contains a unit derived from at least one component selected from the group consisting of laurolactam, aminoundecanoic acid, and aminododecanoic acid.

7. The process according to claim 1, wherein the film sealant has a protective layer laminated to one side of the film sealant, said protective layer comprising a heat-resistant resin comprising at least one member selected from the group consisting of a polyester-series resin, a polyamide-series resin, and a fluorine-containing resin.

* * * * *